United States Patent [15] 3,671,878

Becker [45] June 20, 1972

[54] PROTECTION CIRCUIT FOR AN AMPLIFIER

[72] Inventor: John E. Becker, Wilmette, Ill.

[73] Assignee: Motorola, Inc., Franklin Park, Ill.

[22] Filed: April 27, 1970

[21] Appl. No.: 32,204

[52] U.S. Cl. ................................330/207 P, 330/24, 330/3, 330/16, 330/22

[51] Int. Cl. ......................................H03f 21/00, H03f 5/00

[58] Field of Search................................330/24, 207 P, 22 U

[56] References Cited

UNITED STATES PATENTS

| | | | |
|---|---|---|---|
| 3,551,839 | 12/1970 | Barker | 330/24 X |
| 3,553,601 | 1/1971 | Glasser | 330/24 |
| 3,101,453 | 8/1963 | Simpson et al | 330/22 |
| 3,449,680 | 6/1969 | Schelb et al. | 330/207 P |

OTHER PUBLICATIONS

IBM Technical Bulletin Vol. 2 No. 2 August 1959 pp. 67,68 –" Protection and Indicating Circuit" –Levitre, E. J.

*Primary Examiner*—Nathan Kaufman
*Attorney*—Mueller & Aichele

[57] ABSTRACT

A protection circuit for a driver amplifier is provided which senses the absence of current to a driven amplifier and decreases the voltage supplied to the driver amplifier to a safe value thereby preventing damage to the same. The driver amplifier may be a semiconductor (transistor) amplifier and the driven amplifier may be a vacuum tube amplifier which has a warm up period much longer than that of the semiconductor amplifier. The protection circuit protects the semiconductor amplifier during warm up of the tube amplifier, or in the event of failure thereof by reducing the operating voltage applied thereto.

9 Claims, 1 Drawing Figure

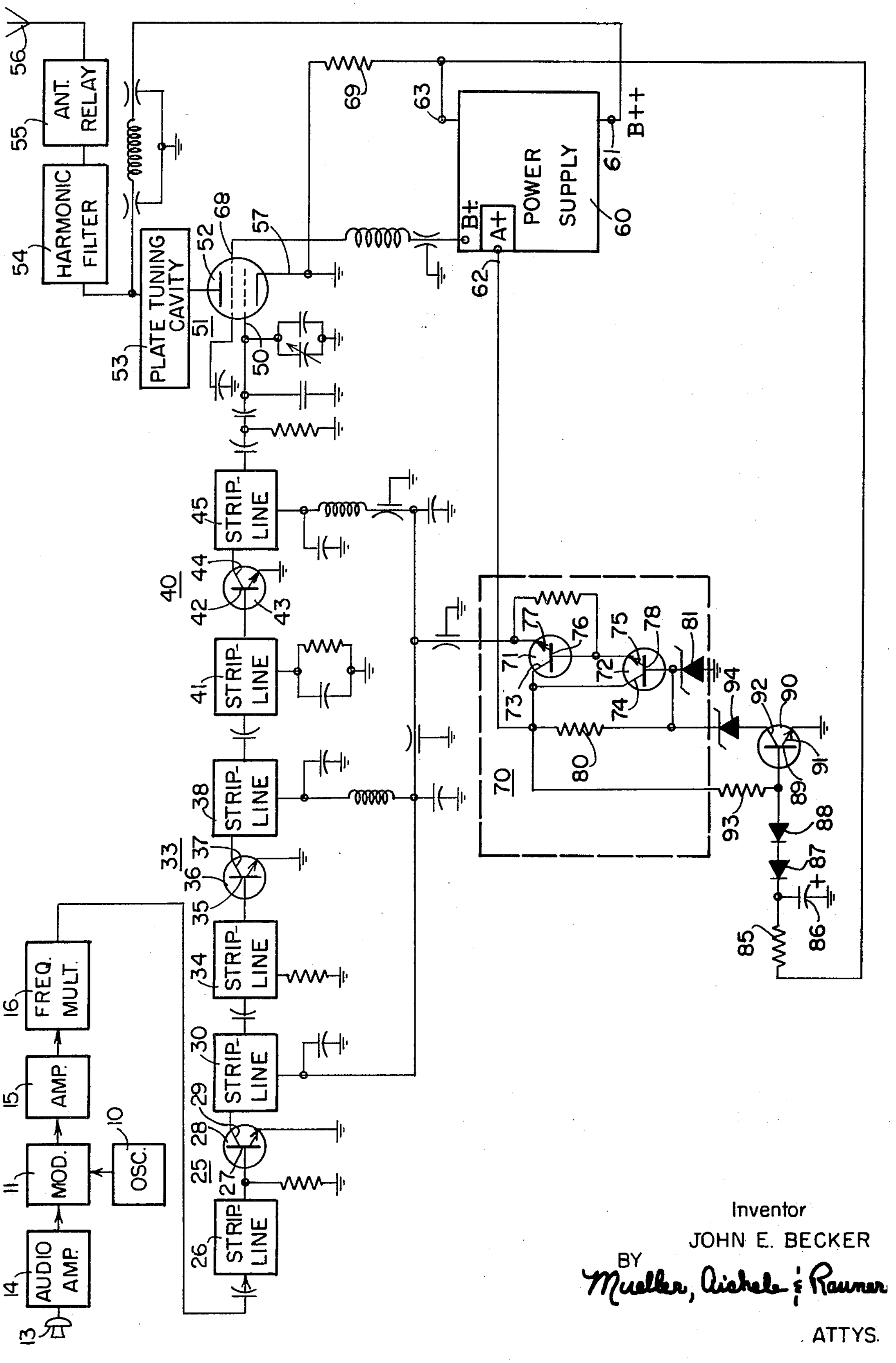
Inventor
JOHN E. BECKER
BY Mueller, Aichele & Rauner
ATTYS.

PROTECTION CIRCUIT FOR AN AMPLIFIER

BACKGROUND OF THE INVENTION

Hybrid transmitters employing a transistor amplifier to drive an electron tube output amplifier have been employed to advantage for a number of years where a substantial output power is required. As the electron tube amplifier is an electron emission device, there is a warm up time required between the time filament voltage is supplied and power is developed by the tube. During this warm up time an improper impedance will be reflected back to the semiconductor amplifier. The semiconductor amplifier will also see an improper impedance should the electron tube be removed, or damaged and inoperative. If the semiconductor amplifier is developing power during the warm up time, or when the electron tube is removed or damaged, the improper impedance can cause excessive dissipation in the semiconductor amplifier thereby seriously damaging the semiconductors.

In prior art circuits, reflected power detection circuits have been used to detect increases in reflected power, such as when the semiconductor amplifier driver sees an improper impedance, and decreases the power of the semiconductor amplifier. Although such circuits have been used to advantage for many years, they are complex, and critical to adjust. Additionally, they require interconnection in the radio frequency (RF) path thereby creating the possibility of circuit regeneration, and increased spurious emissions.

Circuits which sense an increase in current to a transistor amplifier and limit the current supplied thereto have also been used to advantage for many years. These circuits, however, have the same disadvantage as the reflected power detection circuits, and in addition are designed to sense large increases in current rather than a decrease or absence of current.

As an electron tube amplifier is required to operate from an extremely high voltage in order to develop the required power output, any sensing components coupled between the power supply and the final amplifier would be required to withstand the high operating voltage. That is, if the operating voltage coupled to the electron tube final were 700 volts, a resistor in series with the electron tube must have a 700-volt breakdown characteristic. Components with these characteristics are extremely large and expensive, and cannot be conveniently employed in a radio transmitter to be used in a mobile environment.

SUMMARY OF THE INVENTION

It is, therefore, an object of this invention to provide a protection circuit for an amplifier which senses the absence of operating current to a second amplifier and acts to decrease the power of the first amplifier driving the second amplifier to a safe level.

Another object of this invention is to provide a protection circuit for an amplifier which circuit employs components having a low voltage breakdown characteristic.

Yet another object of this invention is to provide a protection circuit for an amplifier which is not connected in the RF path.

A further object of the invention is to provide a protection circuit for a transistor driver amplifier which drives a vacuum tube final amplifier in a radio transmitter to protect the transistor amplifier while the tube amplifier warms up, and in the event of failure of the tube amplifier.

In practicing this invention a protection circuit for an electronic amplifier is provided which includes a first amplifier for amplifying an RF signal and a second amplifier, connected to the first amplifier, for further amplifying the signal amplified by the first amplifier. A power supply supplies an operating current to the second amplifier and an operating voltage to the first amplifier. A control circuit is provided which has a current sensing portion in series with the current path between the second amplifier and the power supply. A voltage limiting portion of the control circuit, connected between the power supply and the first amplifier, limits the operating voltage to a predetermined amount. A third portion of the control circuit operates in response to a decrease in operating current or the absence of operating current, flowing through the current sensing portion to control the voltage limiting portion and reduce the operating voltage supplied to the first amplifier to a safe level.

BRIEF DESCRIPTION OF THE DRAWING

The single FIGURE is a combined schematic and block diagram of a radio transmitter employing a hybrid semiconductor electron tube amplifier, and a protection circuit for the amplifier in accordance with this invention.

DETAILED DESCRIPTION

Referring to the drawing, a high frequency signal is developed by oscillator 10, and coupled to modulator 11. Speech signals are converted to electronic signals by microphone 13, which are amplified in audio amplifier 14 and coupled to modulator 11 to modulate the high frequency signals from oscillator 10. The modulated signal is amplified in amplifier 15 and multiplied to the desired frequency in frequency multiplier 16.

The output signal from frequency multiplier 16 is amplified in semiconductor amplifiers 25, 33 and 40, each of which includes a transistor with a stripline input circuit and a stripline output circuit. The signal from multiplier 16 is coupled through stripline impedance matching device 26 to base 27 of transistor 28 of amplifier 25. Impedance matching device 26 is a stripline conductor which has inductive and capacitive characteristics necessary to provide a proper impedance match at base 27 of transistor 28. The output signal from collector 29 of transistor 28 is coupled through stripline matching devices 30 and 34 to semiconductor amplifier 33. Signals from stripline matching device 34 are applied to base 35 of transistor 36 of the amplifier 33. The output signal from collector 37 of transistor 36 is coupled through stripline matching devices 38 and 41 to semiconductor amplifier 40. Signals from stripline matching device 41 are applied to base 42 of transistor 43 of the amplifier 40. The output signal from collector 44 of transistor 43 is coupled through stripline matching device 45 to grid 50 of electron tube 51. The output signal of electron tube 51 is coupled from plate 52 through plate tuning cavity 53, harmonic filter 54, and antenna relay 55 to antenna 56.

Power supply 60 supplies the voltage necessary to operate the amplifier stages. A high voltage necessary to operate electron tube 51 at the desired power level is developed by power supply 60 and coupled from terminal 61, labelled B++, through plate tuning cavity 53 to plate 52 of electron tube 51. In the preferred embodiment, the voltage developed at terminal 61 is about 740 volts. The operating current for electron tube 51 flows from ground potential through current sensing resistor 69, power supply 60, plate tuning cavity 53, and electron tube 51 back to ground potential. With sensing resistor 69 serially connected from terminal 63 to ground potential, cathode 57 of electron tube 51 can be coupled to ground potential. This minimizes problems of regeneration and spurious emission associated with circuits where the cathode is isolated from ground potential. Isolating the negative terminal of power supply 60 from ground potential creates no spurious emission or regeneration problems. As resistor 69 isolates power supply 60 from ground potential, the voltage developed at junction 63 due to the operating current will be negative with respect to ground.

Power supply 60 also develops a low voltage necessary to operate semiconductor amplifiers 25, 33 and 40. This operating voltage is coupled from terminal 62 of power supply 60 through voltage regulator 70 and other circuit components to the collector electrodes of transistors 28, 36 and 43.

Voltage regulator 70 includes transistors 71 and 72 coupled together in a standard Darlington configuration. That is, collectors 73 and 74 of transistors 71 and 72 respectively are coupled to terminal 62 of power supply 60. Emitter 75 of transistor 72 is coupled to base 76 of transistor 71. Emitter 77 of transistor 71 provides the output of Darlington connected transistor regulator 70. Resistor 80 coupled from collector 74 to base 78 of transistor 72, and zener diode 81 coupled from base 78 of transistor 72 to ground potential, provide the bias potential at base 78 of transistor 72 required to forward bias transistors 71 and 72. Zener diode 81 is selected such that the regulated voltage developed at emitter 77 of transistor 71 when coupled to the transistors of semiconductor amplifiers 25, 33 and 40 is sufficient to provide the voltage required to operate the amplifiers at a desired power level.

When electron tube 51 has been allowed to warm up and is operating properly, it will draw a predetermined amount of cathode-plate operating current. In the preferred embodiment the operating current will be approximately 300 milliampers. The operating current for electron tube 51 will flow through current sensing resistor 69 developing a negative voltage at junction 63. If the resistance of resistor 69 is relatively low, a small negative sensing voltage will be developed thereacross allowing the use of a resistor having a low breakdown and low power characteristic. The sensing voltage developed across resistor 69 will be filtered by resistor 85 and capacitor 86, and coupled through diodes 87 and 88 to base 89 of control transistor 90. A bias circuit consisting of resistor 93, diodes 87 and 88, and resistors 85 and 69, serially connected from collector 73 of transistor 71 to ground potential, develops a bias potential at the junction of resistor 93 and diode 88. The bias potential is coupled to base 89 of transistor 90 rendering transistor 90 conductive if no sensing voltage is developed across resistor 69. The negative sensing voltage coupled from resistor 69 to base 89 of transistor 90 adds to the bias voltage, reducing the bias potential developed at base 89 of transistor 90 and rendering transistor 90 non-conductive. Emitter 91 of transistor 90 is coupled to ground potential and zener diode 94 is coupled from the collector 92 of transistor 90 to the base 78 of transistor 72. With transistor 90 rendered non-conductive, zener diode 94 will be rendered non-conductive thereby allowing zener diode 81 to establish the bias voltage at base 78 of transistor 72. The regulated voltage developed by voltage regulator 70 will then be sufficient to provide the voltage required to operate the transistors of amplifiers 25, 33 and 40 at the desired power levels.

If electron tube 51 has not had a sufficient warm up time or if it should be damaged and open circuited or removed from the circuit, less than the required operating current will flow through resistor 69 and power supply 60 to electron tube 51. If the operating current is below a predetermined level, the sensing voltage coupled from resistor 69 to base 89 of transistor 90 will be less than the voltage required to overcome the forward bias potential developed at the junction of resistor 93 and diode 88. Transistor 90 will saturate due to the forward bias potential at base 89, providing a ground path for zener diode 94. Zener diode 94 is selected to have a lower zener voltage than zener diode 81. With a ground path provided for zener diode 94, zener diode 94 will conduct, lowering the bias voltage at base 78 of transistor 72 to the zener voltage of zener diode 94. The regulated voltage developed at emitter 77 of transistor 71 will therefore also decrease by a corresponding amount. For example, if the zener diode voltage of zener diode 81 is 27.3 volts, the regulated voltage developed at emitter 77 of transistor 71 will be 26 volts. If the zener diode voltage of zener diode 94 is 23.8 volts, the regulated voltage developed at emitter 77 of transistor 71 when control transistor 90 is conducting, will be 23.0 volts. The voltage at emitter 77 of transistor 71 is 23.0 volts rather than 22.5 volts because of the 0.5 volts appearing between emitter 91 and collector 92 of transistor 90. The lower regulated voltage when coupled from emitter 77 of transistor 71 to the transistors of semiconductor amplifiers 25, 33 and 40 will lower the output power developed by semiconductor amplifiers 25, 33 and 40 to a safe value thereby preventing damage to the semiconductor amplifiers due to overdissipation.

As can be seen a transmitter protection circuit for a hybrid semiconductor-electron tube amplifier has been provided which senses the absence of operating current to the electron tube and acts to decrease the power of the semiconductor amplifier driving the electron tube to a safe level. As the sensing portion of the control circuit is not in the high voltage path, components having a low voltage breakdown characteristic can be employed.

I claim:

1. A protection circuit for an electronic amplifier, including in combination, first amplifier means for amplifying a signal coupled thereto and to be protected, a second amplifier coupled to said first amplifier means for further amplifying the signal amplified by said first amplifier means, power supply means for supplying an operating current and an operating voltage, means forming a current path between said second amplifier and said power supply means for supplying current to said second amplifier from said power supply means, said means including current sensing means connected in series in said current path from said power supply means to a reference potential for sensing the current in said current path and developing a sensing signal which varies in accordance with variations in said current, a control circuit coupling said power supply means to said first amplifier means for supplying said operating voltage thereto, said control circuit having a voltage regulating portion for regulating the operating voltage from said power supply means, and supplying a regulated voltage having a first amplitude to said first amplifier means, said control circuit further having circuit means coupled to said voltage regulating portion and said current sensing means and operative in response to a reduced sensing signal to control said regulating portion to reduce said regulated voltage from said first amplitude to a second, lower, amplitude for operating said first amplifier means at a safe level.

2. The protection circuit of claim 1 wherein said first amplifier means having at least one state is a semiconductor amplifier.

3. The protection circuit of claim 2 wherein said second amplifier is an electron tube amplifier.

4. The protection circuit of claim 3 wherein said current sensing means includes, resistance means connected from said power supply means to said reference potential in said current path, said operating current flowing through said resistance means to develop said sensing signal.

5. The protection circuit of claim 4 wherein said voltage regulating portion includes, voltage regulating semiconductor means, said semiconductor means having an output electrode coupled to said first amplifier means for supplying said regulated operating voltage to said first amplifier means, an input electrode coupled to said power supply means for receiving said operating voltage therefrom, and a control electrode, a bias circuit, including first bias means, coupled to said control electrode for establishing a bias potential thereat, said semiconductor means operative in response to said bias potential to limit said regulated operating voltage to said first amplitude, said semiconductor means operative in response to a reduction of said bias potential to reduce the regulated operating voltage to said first amplifier to said second amplitude.

6. The protection circuit of claim 5 wherein said first bias means is a zener diode.

7. The protection circuit of claim 5 wherein said circuit means includes, a control semiconductor, said control semiconductor having a control electrode coupled to said current sensing means, a first electrode coupled to a reference potential, and a second electrode, second bias means coupled to said second electrode and said control electrode of said voltage regulating semiconductor means, said control semiconductor being responsive to a reduction in said sensing signal below a predetermined level to become conductive and couple said second bias means to said reference potential, said second bias means operative in response to said conduction to reduce said bias potential.

8. The protection circuit of claim 7 wherein said second bias means is a zener diode.

9. A protection circuit for an electronic amplifier, including in combination, first amplifier means for amplifying a signal coupled thereto and to be protected, a second amplifier coupled to said first amplifier means for further amplifying the signal amplified by said first amplifier means, power supply means for supplying an operating current and an operating voltage, means forming a current path between said second amplifier and said power supply means for supplying current to said second amplifier from said power supply means, said means including current sensing means connected in series in said current path from said power supply means to a reference potential for sensing the current in said current path and developing a sensing signal which varies in accordance with said variations in said current, a control circuit including a voltage regulating portion having a voltage regulating semiconductor means, said semiconductor means having an output electrode coupled to said first amplifier means for supplying said regulated operating voltage to said first amplifier means, an input electrode coupled to said power supply means for receiving said operating voltage therefrom, and a control electrode, a bias circuit including first bias means coupled to said control electrode for establishing a bias potential thereat, said semiconductor means operative in response to said bias potential to limit said regulated operating voltage to a first amplitude, said semiconductor means operative in response to a reduction of said bias potential to reduce the regulated operating voltage to said first amplifier to a second amplitude, said control circuit further having circuit means coupled to said voltage regulating semiconductor means control electrode and to said current sensing means and operative in response to a reduced sensing signal to reduce said bias potential.

* * * * *